United States Patent
Jeong

(10) Patent No.: US 11,366,603 B2
(45) Date of Patent: Jun. 21, 2022

(54) STORAGE STRUCTURE AND ERASE METHOD THEREOF

(71) Applicant: Wuhan Xinxin Semiconductor Manufacturing Co., Ltd., Wuhan (CN)

(72) Inventor: Jongbae Jeong, Shanghai (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 0 days.

(21) Appl. No.: 17/049,972

(22) PCT Filed: Dec. 17, 2019

(86) PCT No.: PCT/CN2019/125963
§ 371 (c)(1),
(2) Date: Oct. 23, 2020

(87) PCT Pub. No.: WO2021/109243
PCT Pub. Date: Jun. 10, 2021

(65) Prior Publication Data
US 2021/0326057 A1    Oct. 21, 2021

(30) Foreign Application Priority Data
Dec. 2, 2019 (CN) .......................... 201911214611.5

(51) Int. Cl.
    *G06F 3/06* (2006.01)
(52) U.S. Cl.
    CPC ............ *G06F 3/0652* (2013.01); *G06F 3/064* (2013.01); *G06F 3/0619* (2013.01); *G06F 3/0659* (2013.01); *G06F 3/0679* (2013.01)
(58) Field of Classification Search
    CPC ...... G06F 3/0652; G06F 3/0619; G06F 3/064; G06F 3/0659; G06F 3/0679
    See application file for complete search history.

(56) References Cited

U.S. PATENT DOCUMENTS

2011/0176369 A1    7/2011  Chen
2017/0285969 A1*  10/2017  Madraswala ........ G11C 16/225

FOREIGN PATENT DOCUMENTS

CN    101800078 A    8/2010
CN    103488462 A    1/2014
(Continued)

OTHER PUBLICATIONS

Search Report dated Aug. 27, 2020 for WO application No. PCT/CN2019/125963, filing date: Dec. 17, 2019, pp. 1-9.

*Primary Examiner* — David Yi
*Assistant Examiner* — Dustin B. Fulford
(74) *Attorney, Agent, or Firm* — Winston Hsu

(57) ABSTRACT

The invention provides a storage structure and an erase method thereof, capable of performing an erase operation on a plurality of memory blocks. The storage structure includes: a first storage body, a second storage body, a third storage body, and a controller. Memory blocks that are consecutively numbered are sequentially alternately stored in the first memory bank, the second memory bank, and the third memory bank, and the controller is configured to control each memory block to sequentially undergo a first process, a second process and a third process. The erase method includes: when a memory block Bi undergoes the third process, a memory block Bi+1 undergoes the second process, and a memory block Bi+2 undergoes the first process at the same time; where i ∈ [1, n−2]. Three adjacent blocks undergo the first process, the second process, and the third process simultaneously.

15 Claims, 4 Drawing Sheets

(56) References Cited

FOREIGN PATENT DOCUMENTS

| | | |
|---|---|---|
| CN | 103700401 A | 4/2014 |
| CN | 107102816 A | 8/2017 |

\* cited by examiner

STORAGE STRUCTURE AND ERASE METHOD THEREOF

BACKGROUND OF THE INVENTION

1. Field of the Invention

The present invention relates to semiconductor devices, and in particular, to a storage structure and an erase method thereof.

2. Description of the Prior Art

The main features of flash memories are fast working speed, small cell area, high integration and good reliability. The flash memory is able to be rewritten more than 100,000 times, and data can be reliably maintained for more than 10 years. The two main types of flash memory on the market today are NOR and NAND non-volatile flash memory. The NOR flash memory (Nor Flash) has a small cell area and short read or write operation time, and thus is widely used. At present, the mainstream Nor Flash is based on floating-gate flash memory technology. In order to save size, its storage area is generally placed in a matrix form, and then logically divided into memory blocks.

In an erase operation, the memory blocks are sequentially erased block by block. Usually the erase operation includes a pre-programing step, an erase step and an over-erase correction step (OEC). The pre-programming step changes all binary values from ONE in the memory block to ZERO; the erase step applies a larger erase pulse to the memory block so that the threshold voltage of the memory block is lower than a specific level value; and the over-erase correction step repairs over-erased memory blocks by a repair operation, which prevents the threshold voltage from being too low. Since the erase operation requires these three steps and the non-volatile flash memory comprises a large number of memory blocks, to erase an entire non-volatile flash memory is time-consuming compared to read/write operations. Thus, how to improve the overall erasing efficiency of the non-volatile flash memory is a problem which needs to be solved urgently.

SUMMARY OF THE INVENTION

An objective of the present invention is to provide a storage structure and an erase method thereof, so as to solve the problem of low efficiency of erase operations on the nonvolatile flash memory.

In order to achieve the above goal, the present invention provides a storage structure capable of performing an erase operation on memory blocks $B_1, B_2 \ldots B_n$, where n is an integer greater than or equal to 3, and the storage structure includes: a first memory bank; a second memory bank; a third memory bank; and a controller, where the memory blocks $B_1, B_2, \ldots, B_n$, that are consecutively numbered are sequentially alternately arranged in the first memory bank, the second memory bank, and the third memory bank. The controller is used to control the memory blocks to sequentially undergo an erase operation, where the erase operation includes sequentially performing a first process, a second process, and a third process. Once the erase operation is applied to a memory block, the memory block undergoes the first process, the second process and the third process sequentially.

When a memory block $B_i$ undergoes the third process, a memory block $B_{i+1}$ undergoes the second process, and a memory block $B_{i+2}$ undergoes the first process, where i ∈ [1, n−2].

Optionally, after the memory block $B_1$ has completed the first process, the memory block $B_1$ undergoes the second process, and at the same time, the memory block $B_2$ undergoes the first process, and then the erase method is performed in the same way on the remaining memory blocks. After the memory block $B_1$ has completed the third process, the memory block $B_{i+1}$ has completed the second process and the memory block $B_{i+2}$ has completed the first process, the memory block $B_{i+1}$ undergoes the third process; until the memory block $B_{n-1}$ has completed the second process, the memory block $B_{n-1}$ undergoes the third process, while the memory block $B_n$ undergoes the second process; after the memory block $B_n$ has completed the second process, it undergoes the third process to complete the entire erase of the Nor Flash memory.

Optionally, the first process includes a pre-programming step, the second process includes an erase step, and the third process includes an over-erase correction step.

Optionally, the numbers of the memory blocks in the first memory bank, the second memory bank, and the third memory bank are all the same.

Optionally, the numbers of the memory blocks in the first memory bank and the second memory bank are the same, and the number of the memory blocks in the third memory bank is not the same as those in the first memory bank and in the second memory bank. Alternatively, the numbers of the memory blocks in the second memory bank and the third memory bank are the same, and the number of the memory blocks in the first memory bank is not the same as those in the second memory bank and in the third memory bank.

Optionally, the storage structure includes M memory banks, where M≥3.

Optionally, the controller includes:
a first memory bank controller, coupled to and controlling the first memory bank;
a second memory bank controller, coupled to and controlling the second memory bank;
a third memory bank controller coupled to and controlling the third memory bank;
a chip controller coupled to the first memory bank controller, the second memory bank controller, and the third memory bank controller and capable of operating the first memory bank controller, the second memory bank controller, and the third memory bank controller simultaneously.

Optionally, the storage structure is a Nor flash.

The present invention also provides a method for erasing a storage structure, which is used to perform an erase operation on memory blocks $B_1, B_2 \ldots B_n$, where n is an integer greater than or equal to 3, the method comprising:
sequentially alternately arranging the memory blocks $B_1 B_2, \ldots, B_n$ that are consecutively numbered to in a first memory bank, a second memory bank, and a third memory bank; and
controlling the memory blocks to sequentially undergo an erase operation.

The erase operation includes sequentially performing a first process, a second process, and a third process, wherein once the erase operation is applied to a memory block, the memory block undergoes the first process, the second process and the third process sequentially. In response to a memory block $B_i$ undergoing the third process, a memory block $B_{i+1}$ undergoes the second process, and a memory block $B_{i+2}$ undergoes the first process, where i ∈ [1, n−2].

Optionally, the method of erasing the storage structure erases the storage structure entirely.

In the storage structure and the erase method provided by the embodiment of the present invention, an erase operation can be performed on the memory blocks $B_1, B_2, \ldots, B_n$, where n is an integer greater than or equal to 3, and includes: a first memory bank, a second memory bank, a third memory bank and a controller. The memory blocks $B_1, B_2 \ldots B_n$, that are consecutively numbered are sequentially alternately arranged in the first memory bank, the second memory bank, and the third memory bank, and the controller is configured to control the memory blocks to sequentially undergo the erase operation. The erase operation includes sequentially performing a first process, a second process, and a third process. Once the erase operation is applied to a memory block, the memory block undergoes the first process, the second process and the third process sequentially In response to a memory block $B_i$ undergoing the third process, a memory block $B_{i+1}$ undergoes the second process while a memory block $B_{i+2}$ undergoes the first process, where $i \in [1, n-2]$. Three adjacent blocks in the present invention undergo the first process, the second process, and the third process simultaneously, thereby saving the erase time of the entire erase operations of the storage structure, improving the erasing efficiency without requiring any extra circuits. The storage structure and erase method can therefore be implemented without leading to an increase in costs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
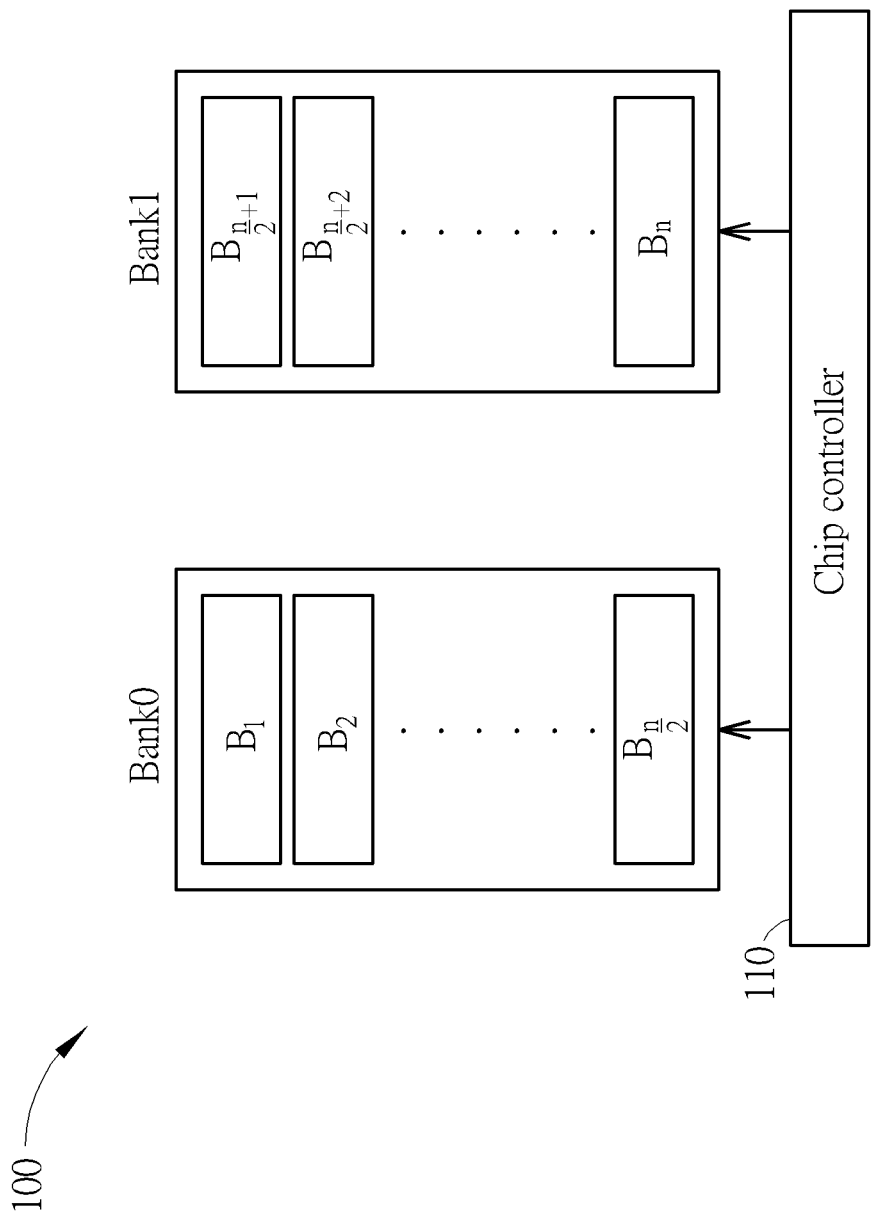
FIG. 1 is a schematic structural diagram of a storage structure according to the related art.

FIG. 1 is a schematic structural diagram of a storage structure 100. As shown in FIG. 1, the storage structure 100 includes two memory banks, namely a first bank Bank0 and a second bank Bank1. The first bank Bank0 and the second bank Bank1 are both coupled to a chip controller 110. The chip controller 110 is configured to control the first bank Bank0 and the second bank Bank1 to perform operations such as read, write, and erase. A total of n (n≥2) memory blocks are arranged in the first bank Bank0 and the second bank Bank1. The memory blocks in the first bank Bank0 and the second bank Bank1 are evenly distributed. For the convenience of description, the n memory blocks are sequentially numbered as: $B_1, B_2 \ldots B_n$, where $B_1, B_2 \ldots B_{n/2}$ are arranged in the first bank Bank0, and $B_{n/2+1}, B_{n/2+2} \ldots B_n$ are arranged in the second bank Bank1.

Figure 2:
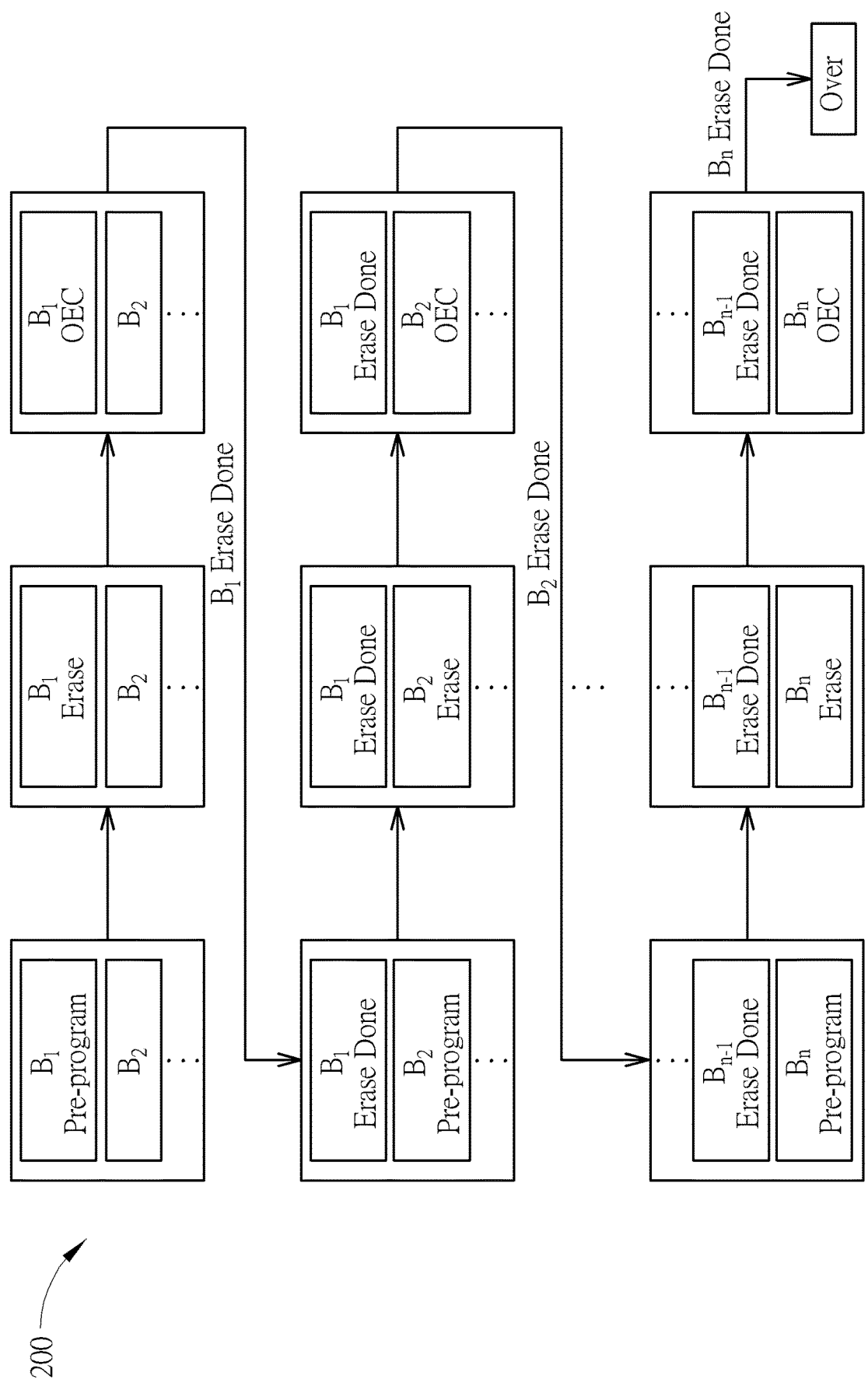
FIG. 2 is a flowchart of the erasing method of the storage structure shown in FIG. 1.

FIG. 2 is a flowchart 200 of the entire erase operation of the storage structure 100. As shown in FIG. 2, when the storage structure 100 is completely erased, the erase operations are sequentially performed on the memory blocks in the order of $B_1, B_2, \ldots B_n$. First, a pre-program step is performed on $B_1$, then an erase step is performed on memory block $B_1$, and finally an over-erase correction step (OEC) is performed on memory block $B_1$. After the three steps are completed, the erasing of memory block $B_1$ is completed (Erase Done). Next, the pre-programming step, the erase step, and the over-erase correction step are sequentially performed on the memory block $B_2$ to complete the erasing of the memory block B2. Then, the above three steps are sequentially performed on all of the rest memory blocks until the last memory block $B_n$ is erased, and the storage structure 100 is entirely erased.

This erase method of the storage structure 100 repeats three steps separately for each memory block. The erase operation will be performed on a next memory block until a previous memory block completes the three steps. There are many blocks within the storage structure (for example, n=256), however. It takes a lot of time to complete the entire erasing of the storage structure 100, and the erasing efficiency is low.

The specific embodiments of the present invention will be described in more detail below with reference to the schematic diagrams. The advantages and features of the invention will become clearer from the following description. It should be noted that the drawings are in a very simplified form and all use inaccurate proportions, which are only used to facilitate and clearly assist the description of the embodiments of the present invention. The numbers of the memory blocks and banks are intended to facilitate explanation of the scheme, which does not mean that the corresponding numbers of the memory blocks and the banks must be set as in the figures, nor does it mean that the numbering of the blocks must be in accordance with the numbering method of this invention.

Figure 3:
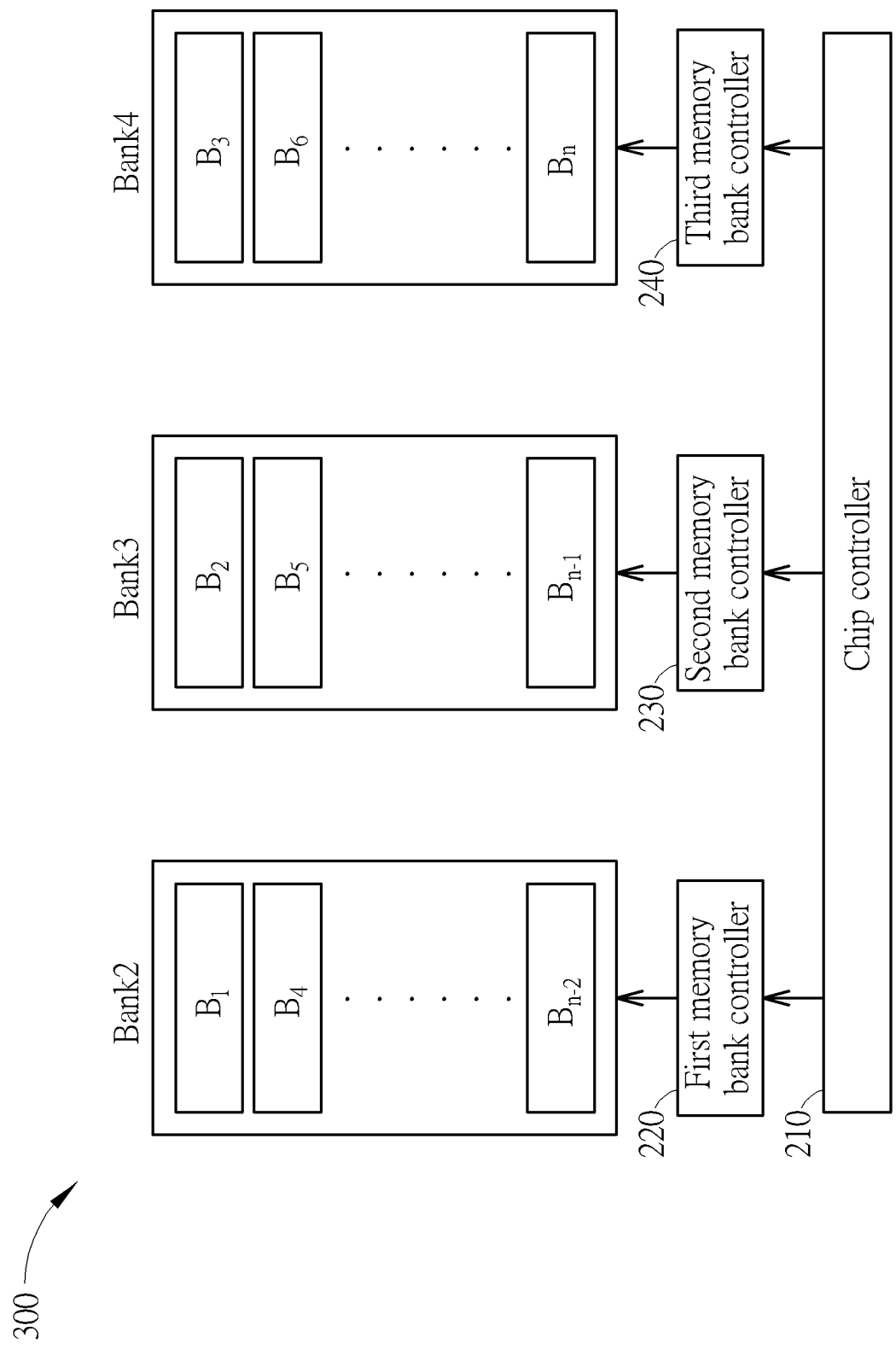
FIG. 3 is a schematic structural diagram of a storage structure according to an embodiment of the present invention.

FIG. 3 is a schematic structural diagram of a storage structure 300 provided by this embodiment. The storage structure 300 may be a Nor Flash, which includes at least three banks, namely a first bank Bank2, a second bank Bank3, and a third bank Bank4. The first bank Bank2, the second bank Bank3, and the third bank Bank4 store a total of n (n≥3) memory blocks, and the n memory blocks are evenly and alternately distributed in the first bank Bank2, the second bank Bank3 and the third bank Bank4. For ease of description, the n memory blocks are sequentially numbered as: $B_1, B_2 \ldots B_n$. In this embodiment, n is a multiple of three. In this way, the memory blocks $B_1, B_4, B_7 \ldots B_{n-2}$ are arranged in the first memory Bank2, the memory blocks $B_2, B_5, B_8 \ldots B_{n-1}$ are arranged in the second memory Bank3, and the memory blocks $B_3, B_6, B_9 \ldots B_n$ are arranged in the third bank Bank4. At this time, the number of memory blocks stored in each of the first bank Bank2, the second bank Bank3, and the third bank Bank4 are the same.

When n is not a multiple of 3, the arranging of memory blocks in the memory banks may be according to one of the following scenarios: 1) the numbers of memory blocks in the first bank Bank2 and the second bank Bank3 are the same, and there is one less memory block in the third memory bank Bank4 than in the first memory bank Bank2 and the second memory bank Bank3; or 2) the numbers of memory blocks in the second memory bank Bank3 and the third memory bank Bank4 are the same, and there is one more memory block in the first memory bank Bank2 than in the second memory bank Bank3 and the third memory bank Bank4. This does not affect the implementation of the present invention.

In addition, the number of memory banks is not limited to three, and it may be M, where M is preferably a multiple of three. When M is not a multiple of three, the scheme of this invention may still be applied to most memory banks in a storage structure.

The storage structure 300 further includes a controller, which comprises a chip controller 210, a first memory bank controller 220, a second memory bank controller 230, and a third memory bank controller 240. The first memory bank controller 220 is coupled to and controls the first memory bank Bank2, the second memory bank controller 230 is coupled to and controls the second memory bank Bank3, and the third memory bank controller 240 is coupled to and controls the third memory bank Bank4. The chip controller 210 is coupled to the first memory bank controller 220, the second memory bank controller 230, and the third memory bank controller 240, and is configured to control the first memory bank Bank2, the second memory bank Bank3 and the third memory bank Bank4 to perform operations such as read, write, and erase. Because addresses of the first memory bank Bank2, the second memory bank Bank3, and the third memory bank Bank4, and their bias conditions (voltages required to be applied to the source, drain, or gate) are different, this embodiment relies on the chip controller 210 to totally control the first memory bank controller 220, the second memory bank controller 230, and the third memory bank controller 240. The first memory bank controller 220, the second memory bank controller 230 and the third memory bank controller 240 control the first memory bank Bank2, the second memory bank Bank3, and the third memory bank Bank4 respectively, such that the chip controller 210 can simultaneously operate the memory blocks in the first memory bank Bank2, the second memory bank Bank3, and the third memory bank Bank4.

It should be understood, however, that according to existing integrated circuit design and manufacturing technologies, the first memory bank controller 220, the second memory bank controller 230, the third memory bank controller 240, and the chip controller 210 may be integrated into a single control unit, or multiple control units. This can be done by those skilled in the art; this embodiment merely provides a preferred solution.

This embodiment also provides an erase method of the storage structure 300, which is used to perform entire erasing of the storage structure 300. Specifically, the memory blocks are sequentially alternately arranged in the first memory bank Bank2, the second memory bank Bank3, and the third memory bank Bank4. When the storage structure 300 needs to be erased entirely, the controller controls the memory blocks $B_1, B_2 \ldots B_n$ to be sequentially erased. Only when a first process, a second process and a third process are performed on a memory block, will the erase operation be completed on said memory block. The erase method includes: when the memory block $B_i$ undergoes the third process, the memory block $B_{i+1}$ undergoes the second process, and the memory block $B_{i+2}$ undergoes the first process, where $i \in [1, n-2]$. In other words, for the three adjacent memory blocks, memory block $B_1$ undergoes the third process, memory block $B_{i+1}$ undergoes the second process, and memory block $B_{i+2}$ undergoes the first process simultaneously. After the memory block $B_i$ has completed the third process, the memory block $B_{i+1}$ has completed the second process and the memory block $B_{i+2}$ has completed the first process, the erasing of the memory block $B_1$ is completed; then, the memory block $B_{i+1}$ undergoes the third process, while simultaneously the memory block $B_{i+2}$ undergoes the second process, and the memory block $B_{i+3}$ undergoes the first process. This continues in a pipeline manner until the erasing of the memory block $B_n$ is completed, and eventually the storage structure 300 is completely erased.

In this embodiment, the first process includes a pre-programing step, the second process includes an erase step, and the third process includes an over-erase correction step (OEC).

Figure 4:
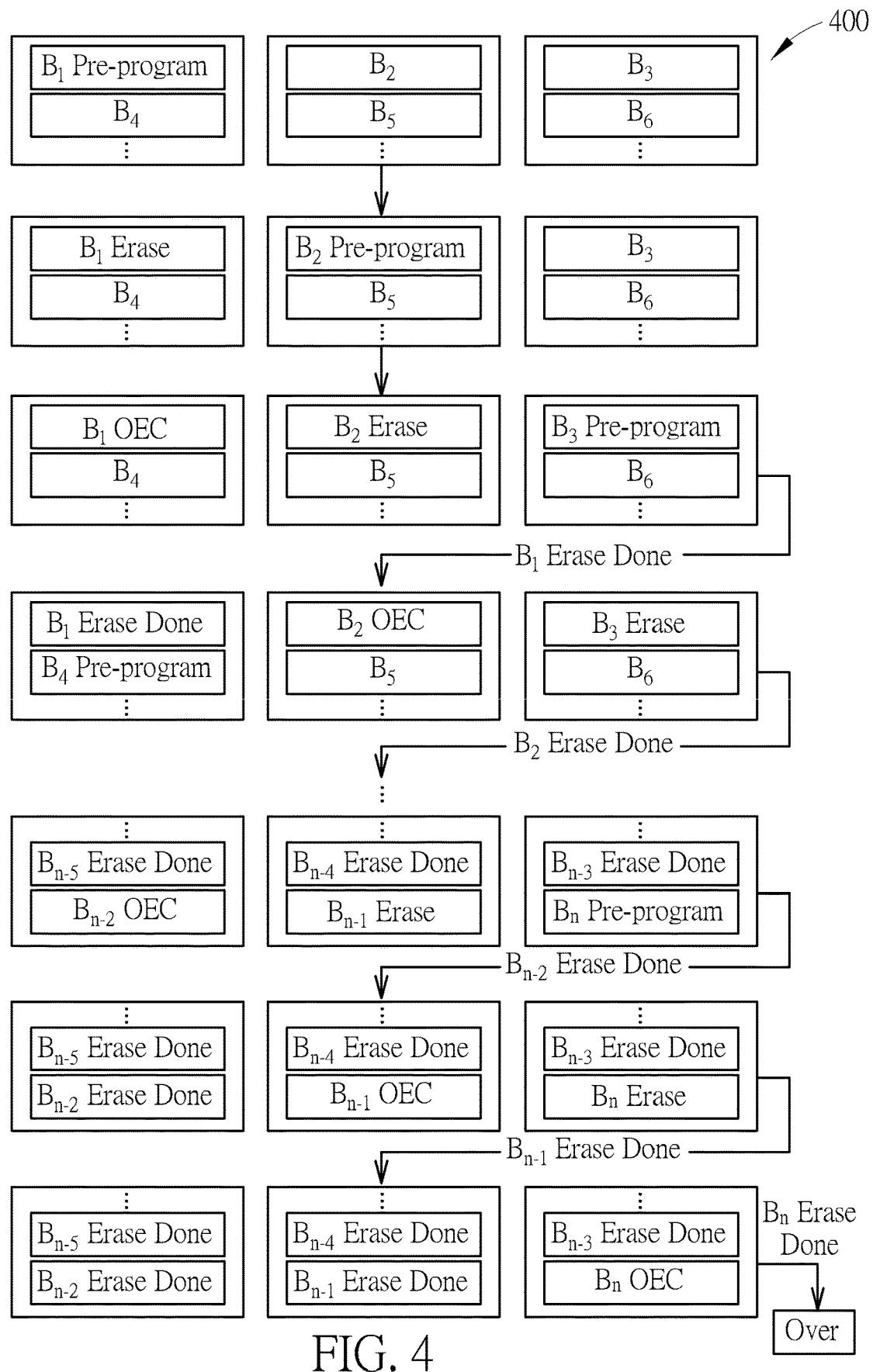
FIG. 4 is a flowchart of a method for erasing a storage structure according to an embodiment of the present invention.

FIG. 4 is a flowchart 400 of the erase method of the storage structure 300 according to this embodiment. The erase method of the storage structure 300 provided in this embodiment will be described in detail with reference to FIGS. 3 and 4.

As shown in FIG. 4, the memory block $B_1$ first undergoes a pre-programming step; after the memory block B1 has completed the pre-programming step, the memory block $B_1$ undergoes an erase step, while at the same time, the memory block $B_2$ undergoes a pre-programming step; after the memory block $B_1$ has completed the erase step and the memory block $B_2$ has completed the pre-programming step, the memory block $B_1$ undergoes an over erase correction step, while the memory block $B_2$ undergoes the erase step, and the memory block $B_3$ undergoes the pre-programming step at the same time. After the memory block $B_1$ has completed the over erase correction step, the memory block $B_2$ has completed the pre-programming step and the memory block $B_3$ has completed the pre-programming step, the memory block $B_1$ has completed the erasing ($B_1$ Erase Done). Next, the memory block $B_2$ undergoes the over erase correction step, while the memory block $B_3$ undergoes the erase step, and the memory block $B_4$ undergoes the pre-programming step at the same time. After the memory block $B_2$ has completed the over erase correction step, the memory block $B_3$ has completed the erase step, and the memory block $B_4$ has completed the pre-programming step, memory block $B_2$ has completed the erasing ($B_2$ Erase Done). These steps are sequentially executed until the memory block $B_{n-2}$ has completed the over erase correction step, the memory block $B_{n-1}$ has completed the erase step, and the memory block $B_n$ has completed the pre-programming step. At this time, the memory block $B_{12-2}$ has completed the erasing ($B_{n-2}$ Erase Done). The memory block $B_{n-1}$ then undergoes the over erase correction step, while the memory block $B_n$ undergoes the erase step at the same time. After the memory block $B_{n-1}$ has completed the over erase correction step, and the memory block $B_n$ has completed the erase step, the memory block $B_{n-1}$ has completed the erasing ($B_{n-1}$ Erase Done). Then, the memory block $B_n$ needs to individually undergo the over erase correction step. After the memory block $B_n$ has completed the over erase correction step, the memory block has completed the erasing ($B_n$ Erase Done). Accordingly, the storage structure 200 has completed the entire erasing.

The erase method according to the related art as shown in FIG. 2 requires each memory block to complete the three steps of an erase operation before an erase operation can be begun on a next memory block. In the erase method according to the present invention, because the memory block $B_1$ undergoes the third process while the memory block $B_{i+1}$ undergoes the second process and the memory block $B_{i+2}$ undergoes the first process simultaneously, erasing time is saved, thereby improving erasing efficiency.

In order to prove that the erasing efficiency of the present invention erase method is improved compared to the erase method of the related art, the following assumptions and calculations are made:

Assume n=256, the time of the pre-programming step t1=50 ms, the time of the erase step t2=80 ms, and the time of the over-erase repair step t3=20 ms;

The time T1 required to erase the entire storage structure by using the erase method shown in FIG. 2 is:

T1=(50 ms+80 ms+20 ms)*256=38.4 s

The time T2 required to erase the entire storage structure by using the erase method shown in FIG. 4 is:

T2=50 ms+80 ms*256+20 ms=20.58 s

It can be seen that, compared with the related art, the erase method of the present invention can improve erasing efficiency by about 46.5%.

The erase times listed above are reference values. It is possible that the flash memory has different pre-programming times, erase times, and over erase correction times depending on the manufacturing process and operation mode.

In summary, in the storage structure and the erase method provided by the embodiments of the present invention, erase operations can be performed on memory blocks where n is an integer greater than or equal to 3, and the storage structure includes: a first memory bank, a second memory bank, a third memory bank, and a controller. The memory blocks are sequentially alternately arranged in the first memory bank, the second memory bank, and the third memory bank, and the controller is used to control the memory blocks to sequentially undergo an erase operation according to an erase method. The erase operation includes sequentially performing a first process, a second process, and a third process. The erase method includes: when the memory block $B_1$ undergoes the third process, the memory block $B_{i+1}$ undergoes the second process, while the memory block $B_{i+2}$ undergoes the first process at the same time, where i∈[1, n−2]. Three adjacent blocks thereby undergo the first process, the second process, and the third process simultaneously, which improves the erasing efficiency while requiring no additional circuits. The above structure and method can therefore be implemented without increasing costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A storage structure capable of performing an erase operation on memory blocks $B_1, B_2, \ldots, B_n$, where n is an integer greater than or equal to 3, and the storage structure comprises:
a first memory bank, a second memory bank, and a third memory bank and a controller, where the memory blocks $B_1, B_2, \ldots, B_n$, that are consecutively numbered are sequentially alternately arranged in the first memory bank, the second memory bank, and the third memory bank, wherein the controller is used to control the memory blocks to sequentially undergo an erase operation, and the erase operation includes sequentially performing a first process, a second process, and a third process;
wherein once the erase operation is applied to a memory block, the memory block undergoes the first process, the second process and the third process sequentially; and the erase operation comprises: when a memory block $B_i$ undergoes the third process, a memory block $B_{i+1}$ undergoes the second process, and a memory block $B_{8+2}$ undergoes the first process, where i ∈ [1, n−2].

2. The storage structure according to claim 1, wherein after the memory block $B_1$ has completed the first process, the memory block $B_1$ undergoes the second process while simultaneously the memory block $B_2$ undergoes the first process, and the erase operation is then performed on the remaining memory blocks; after the memory block $B_1$ has completed the third process, the memory block $B_{i+1}$ has completed the second process and the memory block $B_{i+2}$ has completed the first process, the memory block $B_{i+1}$ undergoes the third process; until the memory block $B_{n-1}$ has completed the second process, the memory block $B_{n-1}$ undergoes the third process, while the memory block $B_n$, simultaneously undergoes the second process; after the memory block $B_n$, has completed the second process, the memory block $B_n$, undergoes the third process.

3. The storage structure according to claim 2, wherein the first process includes a pre-programming step, the second process includes an erase step, and the third process includes an over-erase correction step.

4. The storage structure according to claim 2, wherein the numbers of the memory blocks in the first memory bank, the second memory bank, and the third memory bank are the same.

5. The storage structure according to claim 2, wherein the numbers of the memory blocks in the first memory bank and the second memory bank are the same, and the number of the memory blocks in the third memory bank is not the same as those in the first memory bank and the second memory bank; or the numbers of the memory blocks in the second memory bank and the third memory bank are the same, and the number of the memory blocks in the first memory bank is not the same as those in the second memory bank and the third memory bank.

6. The storage structure according to claim 2, wherein the storage structure comprises M memory banks, and M is greater than or equal to 3.

7. The storage structure according to claim 1, wherein the first process includes a pre-programming step, the second process includes an erase step, and the third process includes an over-erase correction step.

8. The storage structure according to claim 1, wherein the numbers of the memory blocks in the first memory bank, the second memory bank, and the third memory bank are the same.

9. The storage structure according to claim 1, wherein the numbers of the memory blocks in the first memory bank and the second memory bank are the same, and the number of the memory blocks in the third memory bank is not the same as those in the first memory bank and the second memory bank; or the numbers of the memory blocks in the second memory bank and the third memory bank are the same, and the number of the memory blocks in the first memory bank is not the same as those in the second memory bank and the third memory bank.

10. The storage structure according to claim 1, wherein the storage structure comprises M memory banks, and M is greater than or equal to 3.

11. The storage structure according to claim 1, wherein the controller comprises:
a first memory bank controller, coupled to the first memory bank for controlling the first memory bank;
a second memory bank controller, coupled to the second memory bank for controlling the second memory bank;
a third memory bank controller, coupled to the third memory bank for controlling the third memory bank; and a chip controller coupled to the first memory bank controller, the second memory bank controller, and the third memory bank controller and capable of operating the first memory bank controller, the second memory bank controller, and the third memory bank simultaneously.

12. The storage structure according to claim 11, wherein the storage structure is a NOR flash memory.

13. The storage structure according to claim 1, wherein the storage structure is a NOR flash memory.

14. An erase method of a storage structure, used to perform an erase operation on memory blocks $B_1, B_2, \ldots, B_n$, where n is an integer greater than or equal to 3, and the method comprises:

sequentially alternately arranging the memory blocks $B_i$ $B_2 \ldots, B_n$, that are consecutively numbered in a first memory bank, a second memory bank, and a third memory bank;

controlling the memory blocks to sequentially undergo the erase operation;

wherein the erase operation comprises sequentially performing a first process, a second process, and a third process, and once the erase operation is applied to a memory block, the memory block undergoes the first process, the second process and the third process sequentially; and further comprises in response to a memory block $B_i$ undergoing the third process, a memory block $B_{i+1}$ undergoes the second process while a memory block $B_{i+2}$ simultaneously undergoes the first process, where $i \in [1, n-2]$.

15. The method according to claim 14, wherein the method erases the storage structure entirely.

* * * * *